(12) United States Patent
Cernea

(10) Patent No.: US 7,978,533 B2
(45) Date of Patent: *Jul. 12, 2011

(54) NAND FLASH MEMORY WITH A PROGRAMMING VOLTAGE HELD DYNAMICALLY IN A NAND CHAIN CHANNEL REGION

(75) Inventor: Raul-Adrian Cernea, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/650,011

(22) Filed: Dec. 30, 2009

(65) Prior Publication Data
US 2010/0103745 A1  Apr. 29, 2010

Related U.S. Application Data

(63) Continuation of application No. 11/621,190, filed on Jan. 9, 2007, now Pat. No. 7,660,156, which is a continuation of application No. 10/842,941, filed on May 10, 2004, now Pat. No. 7,177,197, which is a continuation-in-part of application No. 10/677,349, filed on Oct. 1, 2003, now Pat. No. 6,845,045, which is a continuation of application No. 09/956,201, filed on Sep. 17, 2001, now Pat. No. 6,741,502.

(51) Int. Cl.
*G11C 16/04* (2006.01)
*G11C 16/06* (2006.01)
*G11C 16/10* (2006.01)
*G11C 16/14* (2006.01)

(52) U.S. Cl. .......... 365/185.29; 365/185.18; 365/185.11

(58) Field of Classification Search ............. 365/185.08, 365/185.11, 185.12, 185.17, 185.18, 185.25, 365/185.26, 185.29, 185.24, 189.04
See application file for complete search history.

(56) References Cited

U.S. PATENT DOCUMENTS 5,043,940 A   8/1991   Harari
5,070,032 A  12/1991   Yuan et al.
(Continued)

FOREIGN PATENT DOCUMENTS
EP       0 843 316 A2    5/1998
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — J. H. Hur
(74) *Attorney, Agent, or Firm* — Davis Wright Tremaine LLP

(57) ABSTRACT

Operating voltages to a group of memory cells in an array are supplied via access lines such as word lines and bit lines. The capacitance of associated nodes of the memory cells can latch some of these voltages. Memory operation can continue using the latched voltages even when the access lines are disconnected. In a memory have an array of NAND chains, the capacitance of the channel of each NAND chain can latch a voltage to either enable or inhibit programming. The bit lines can then be disconnected during programming of the group and be used for another memory operation. In one embodiment, the bit lines are precharged for the next verifying step of the same group. In another embodiment, two groups of memory cells are being programmed contemporarily, so that while one group is being programmed, the other group can be verified with the use of the bit lines.

21 Claims, 14 Drawing Sheets

U.S. PATENT DOCUMENTS

| | | | |
|---|---|---|---|
| 5,095,344 | A | 3/1992 | Harari |
| 5,270,979 | A | 12/1993 | Harari et al. |
| 5,313,421 | A | 5/1994 | Guterman et al. |
| 5,315,541 | A | 5/1994 | Harari et al. |
| 5,343,063 | A | 8/1994 | Yuan et al. |
| 5,380,672 | A | 1/1995 | Yuan et al. |
| 5,398,202 | A | 3/1995 | Nakamura |
| 5,570,315 | A | 10/1996 | Tanaka et al. |
| 5,602,987 | A | 2/1997 | Harari et al. |
| 5,623,442 | A | 4/1997 | Gotou |
| 5,642,312 | A | 6/1997 | Harari |
| 5,172,338 | A | 7/1997 | Mehrotra et al. |
| 5,661,053 | A | 8/1997 | Yuan |
| 5,677,873 | A | 10/1997 | Choi et al. |
| 5,712,180 | A | 1/1998 | Guterman et al. |
| 5,740,107 | A | 4/1998 | Lee |
| 5,768,192 | A | 6/1998 | Eitan |
| 5,774,397 | A | 6/1998 | Endoh et al. |
| 5,808,338 | A | 9/1998 | Gotou |
| 5,903,495 | A | 5/1999 | Takeuchi et al. |
| 5,949,716 | A | 9/1999 | Wong et al. |
| 5,953,255 | A | 9/1999 | Lee |
| 5,959,887 | A | 9/1999 | Takashina et al. |
| 5,969,986 | A | 10/1999 | Wong |
| 6,011,725 | A | 1/2000 | Eitan |
| 6,014,755 | A | 1/2000 | Wells et al. |
| 6,046,935 | A | 4/2000 | Takeuchi et al. |
| 6,088,264 | A | 7/2000 | Hazen |
| 6,091,633 | A | 7/2000 | Cernea et al. |
| 6,222,762 | B1 | 4/2001 | Guterman et al. |
| 6,230,233 | B1 | 5/2001 | Lofgren et al. |
| 6,373,746 | B1 | 4/2002 | Takeuchi et al. |
| 6,434,049 | B1 | 8/2002 | Trivedi et al. |
| 6,741,502 | B1 | 5/2004 | Cernea |
| 6,845,045 | B1 | 1/2005 | Cernea |
| 7,027,317 | B2 | 4/2006 | Campardo et al. |
| 7,177,197 | B2 | 2/2007 | Cernea |
| 2004/0057287 | A1 | 3/2004 | Cernea et al. |
| 2004/0136228 | A1 | 7/2004 | Campardo et al. |
| 2007/0109859 | A1 | 5/2007 | Cernea |

FOREIGN PATENT DOCUMENTS

| | | | |
|---|---|---|---|
| JP | 8-321191 | A | 12/1996 |
| JP | 10-064286 | A | 3/1998 |
| JP | 7-287983 | A | 10/1999 |
| JP | 2000-315392 | A | 11/2000 |
| JP | 2001-167590 | A | 6/2001 |
| JP | 2001-167592 | A | 6/2001 |
| WO | WO 03/025937 | A2 | 3/2003 |
| WO | WO 03/025937 | A3 | 3/2003 |

OTHER PUBLICATIONS

European Patent Office, Examination, mailed in related European Patent Application No. 02 770 529.2 (Publication No. WO 03/025937) on Jun. 17, 2004, 2 pages.

ISA/EPO, "Notification of Transmittal of the International Search Report and the Written Opinion of the International Searching Authority, or the Declaration", mailed on Sep. 28, 2005 in application No. PCT/US2005/016007, 11 pages.

EPO/ISA, Notification of Transmittal of the International Search Report or the Declaration, mailed in related International Patent Application No. PCT/US02/29554 (Publication No. WO 03/025937) on Sep. 29, 2003, 4 pages.

European Search Report for European Patent Application No. 02 770 529.2 dated Jan. 4, 2007, 3 pages.

European Search Report for European Patent Application No. 05 749 543.4 dated Mar. 7, 2007, 2 pages.

China State Intellectual Property Office, "First Office Action," mailed in related Chinese Application No. 02818166.2 on Mar. 22, 2007, 5 pages.

JPO, "Office Action," corresponding Japanese Patent Application No. 2003-529469, mailed on May 20, 2008, 10 pages (including translation.).

KRO, "Notice of Preliminary Rejection," corresponding Korean Patent Application No. 2004-7003924, mailed on Sep. 30, 2008, 8 pages (including translation.).

China State Intellectual Property Office, "Office Action," corresponding Chinese Patent Application No. 200580020368.3, mailed on Jan. 9, 2009, 11 pages (including translation.).

JPO, "Office Action," corresponding Japanese Patent Application No. 2003-529469, mailed on Jun. 2, 2009, 4 pages (including translation.).

JPO, "Office Action," corresponding Japanese Patent Application No. 2007-513237, mailed on Oct. 26, 2010, 4 pages (including translation.).

|  | Program | Program inhibit | Verify |
|---|---|---|---|
| SGD | Vdd | Vdd | $V_{ON}$ (5V) |
| Bit line (selected) | 0V | Vdd (1.8-2.5V) | $V_{BLSEN}$ (0.5-0.7V) |
| Bit line (unselected) | Vdd | Vdd | 0V |
| Word Line (selected) | $V_{PGM}$ (12-20V) | $V_{PGM}$ | $V_{VER}$ (0.5-3.5V) |
| Word Line (unselected cell) | $V_{PASS}$ (10V) | $V_{PASS}$ (10V) | $V_{PASS}$ (5.5V) |
| Word Line (unselected NAND chain) | Float | Float | Float |
| SGS | 0V | 0V | $V_{ON}$ |

*FIG. 9*

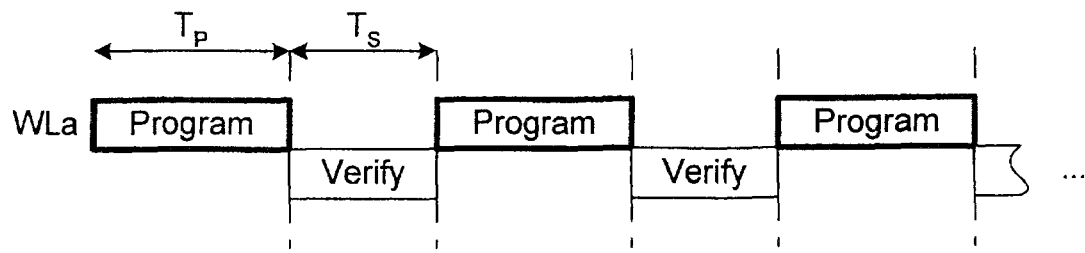
FIG. 13     *(Prior Art)*
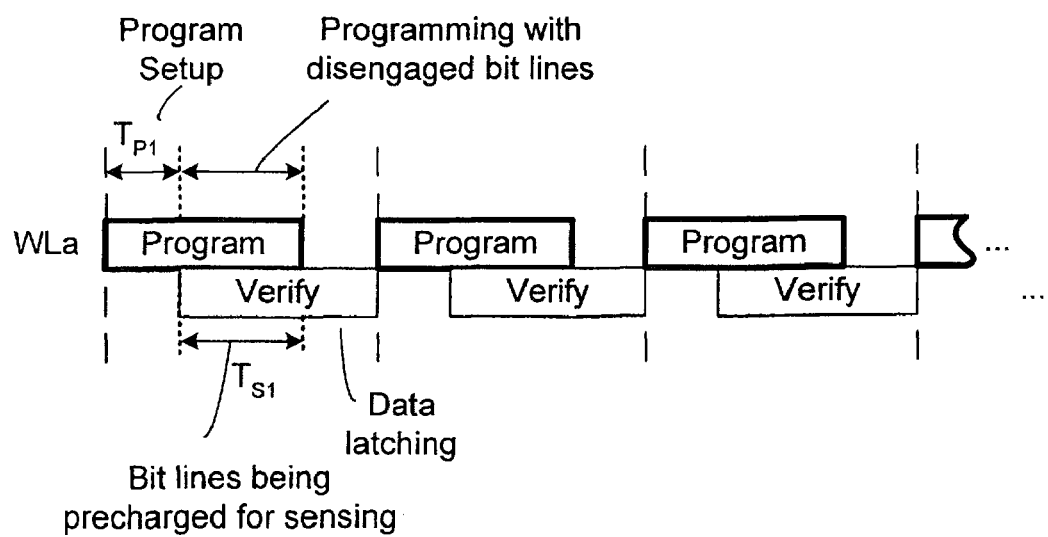
FIG. 14

NAND FLASH MEMORY WITH A PROGRAMMING VOLTAGE HELD DYNAMICALLY IN A NAND CHAIN CHANNEL REGION

This is a Continuation of application Ser. No. 11/621,190, filed on Jan. 9, 2007, now U.S. Pat. No. 7,660,156, which is a Continuation of application Ser. No. 10/842,941, filed May 10, 2004, now U.S. Pat. No. 7,177,197, which is a Continuation-In-Part of application Ser. No. 10/677,349, filed Oct. 1, 2003, now U.S. Pat. No. 6,845,045, which is a continuation of application Ser. No. 09/956,201, filed Sep. 17, 2001, now U.S. Pat. No. 6,741,502, which applications and patents are incorporated herein in their entirety by this reference.

FIELD OF INVENTION

The present invention relates to nonvolatile erasable programmable memories and more specifically, techniques for erasing, programming, or reading these types of memories.

BACKGROUND OF THE INVENTION

Memory and storage is one of the key technology areas that is enabling the growth in the information age. With the rapid growth in the Internet, World Wide Web (WWW), wireless phones, personal digital assistant, digital cameras, digital camcorders, digital music players, computers, networks, and more, there is continually a need for better memory and storage technology. A particular type of memory is nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include CompactFlash (CF) cards, MultiMedia cards (MMC), Flash PC cards (e.g., ATA Flash cards), SmartMedia cards, and memory sticks.

A widely used type of semiconductor memory storage cell is the floating gate memory cell. Some types of floating gate memory cells include Flash, EEPROM, and EPROM. The memory cells are configured or programmed to a desired configured state. In particular, electric charge is placed on or removed from the floating gate of a Flash memory cell to put the memory into two or more stored states. One state is an erased state and there may be one or more programmed states. Alternatively, depending on the technology and terminology, there may be a programmed state and one or more erased states. A Flash memory cell can be used to represent at least two binary states, a 0 or a 1. A Flash memory cell can store more than two binary states, such as a 00, 01, 10, or 11; this cell can store multiple states and may be referred to as a multistate memory cell. The cell may have more than one programmed states. If one state is the erased state (00), the programmed states will be 01, 10, and 11, although the actual encoding of the states may vary.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND chain structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Despite the success of nonvolatile memories, there also continues to be a need to improve the technology. It is desirable to improve the density, speed, durability, and reliability of these memories. It is also desirable to reduce power consumption.

As can be seen, there is a need for improving the operation of nonvolatile memories. Specifically, by allowing background operation of the nonvolatile memory cells, this will speed up operations and reduce power consumption.

SUMMARY OF INVENTION

The invention provides a technique of erasing, programming, or reading nonvolatile memory cells by dynamically applying an operating voltage to the gates of the memory cells, rather than a continuous voltage. This reduces the power consumed during an operation. Dynamic operation such as dynamic erase, dynamic program, dynamic read, also permits any operation, such as read, program, or erase, to occur while selected memory cells are activated. Dynamic operation improves the operational speed of an integrated circuit compared to a continuous operation. This technique may also be referred to as background operation, such as background erase, background program, or background read. In an embodiment, the gates are charged to an operational or operating voltage using a charge pump. The operational voltage may be an erase voltage, program voltage, or read voltage. The pump is then disconnected, and the gates remain at the voltage dynamically. The operating voltage at the gates will be periodically checked and refreshed as needed. While the charge pump is disconnected and the operating voltage is dynamically held at the gates, other operations, possibly on other memory cells, may be performed.

In one embodiment, the invention is a method of operating an integrated circuit with nonvolatile memory cells including turning on a charge pump to generate an erase voltage. One or more erase gates of nonvolatile memory cells selected for erase are charged with the erase voltage. The charge pump is disconnected. The charge pump may also be turned off after it is disconnected. The erase gates are allowed to hold the erase voltage dynamically while the charge pump is disconnected. The selected nonvolatile memory cells are erased using the dynamic erase voltage.

The charge pump may be periodically connected to refresh the erase voltage on the erase gates to refresh the erase voltage on the erase gates. Programming of nonvolatile memory cells, other than the nonvolatile memory cells selected for erase, is permitted while the charge pump is disconnected. Reading of nonvolatile memory cells, other than the nonvolatile memory cells selected for erase, is permitted while the charge pump is disconnected.

The selected nonvolatile memory cells may be checked to see whether they are erased. If the selected nonvolatile memory cells are not erased, the charge pump is connected to refresh the erase voltage on the erase gates. The operation may be repeated.

In another embodiment, the invention is a method of operating an integrated circuit including erasing, programming, or reading selected memory cells by dynamically charging gates of the selected memory cells by periodically directly applying an operational voltage to the gates. Operations on memory cells, other than the selected memory cells, are permitted when the operating voltage is not being directly applied to the gates. When the selected memory cells are considered erased, programmed, or read, the gates of the selected memory cells are discharged to ground. When the selected memory cells are erased, a VT of a floating gate transistor becomes uniformly positive or negative.

In another embodiment, the invention is an integrated circuit including an array of memory cells arranged in rows and columns. There are a number of transfer transistors, each connected to a row of the array of memory cells. There are a number of pumps, each connected to one of the transfer transistors. A pump dynamically charges gates of a row of memory cells to an operating voltage through a respective transfer transistor and the operating voltage is dynamically held at the gates by turning off the respective transfer transistor.

According to another aspect of the invention, a set of bit lines is allowed to transfer a first set of voltage conditions to a first page of memory cells and be held dynamically by the first page to perform a first memory operation while the set of bit lines is freed up to perform another memory operation.

In particular, for a page of NAND chains containing a corresponding page of NAND type memory cells to be programmed in parallel, the first set of voltage conditions are transferred via the set of bit lines and held dynamically at the channels of the NAND chains. This allows the individual channels to be at ground potential to allow programming or be boosted to a higher voltage to inhibit programming as the case may be. The set of bit lines can be disconnected from the page of NAND memory cell after boosting and before the completion of the programming of the page.

In one embodiment, the first memory operation is the programming step of a series of program-verifying cycling operation on the first page of memory, and the other memory operation is the next verifying step. Unlike the conventional case, the verifying step can commence ahead of the completion of the programming step. The bit lines are precharged for the next verifying step of the same page while the programming step is still going on.

In another embodiment, two pages of memory cells are being programmed contemporarily, so that while one page is being programmed, the other page can be verified with the use of the bit lines.

Having a set of voltages to be transferred by access lines such as bit lines or word lines to individual nodes in the memory array and be held dynamically thereat, allows memory operations to take place in the background while the access lines can be used for another operation. This will increase performance since more operations can be performed in a give time.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 9 illustrates a table of example operation voltages for programming operation of a memory cell.

FIG. 13 illustrates a conventional programming cycle where in a program operation is a series of interleaving programming and verifying steps.

FIG. 14 illustrate the embodiment where the verifying step commences ahead of the completion of the programming step during program operation on a page of memory cells.

DETAILED DESCRIPTION OF THE PREFERRED EMBODIMENTS

Integrated circuits providing nonvolatile storage include nonvolatile erasable-programmable memory cells. Many types of integrated circuits having nonvolatile memory cells include memories, microcontrollers, microprocessors, and programmable logic. Nonvolatile memory integrated circuits may be combined with other nonvolatile memory integrated circuits to form larger memories. The nonvolatile memory integrated circuits may also be combined with other integrated circuits or components such as controllers, microprocessors, random access memories (RAM), or I/O devices, to form a nonvolatile memory system. An example of a Flash EEPROM system is discussed in U.S. Pat. No. 5,602,987, which is incorporated by reference along with all references cited in this application. Further discussion of nonvolatile cells and storage is in U.S. Pat. Nos. 5,095,344, 5,270,979, 5,380,672, 6,222,762, and 6,230,233 which are incorporated by reference.

Figure 1:
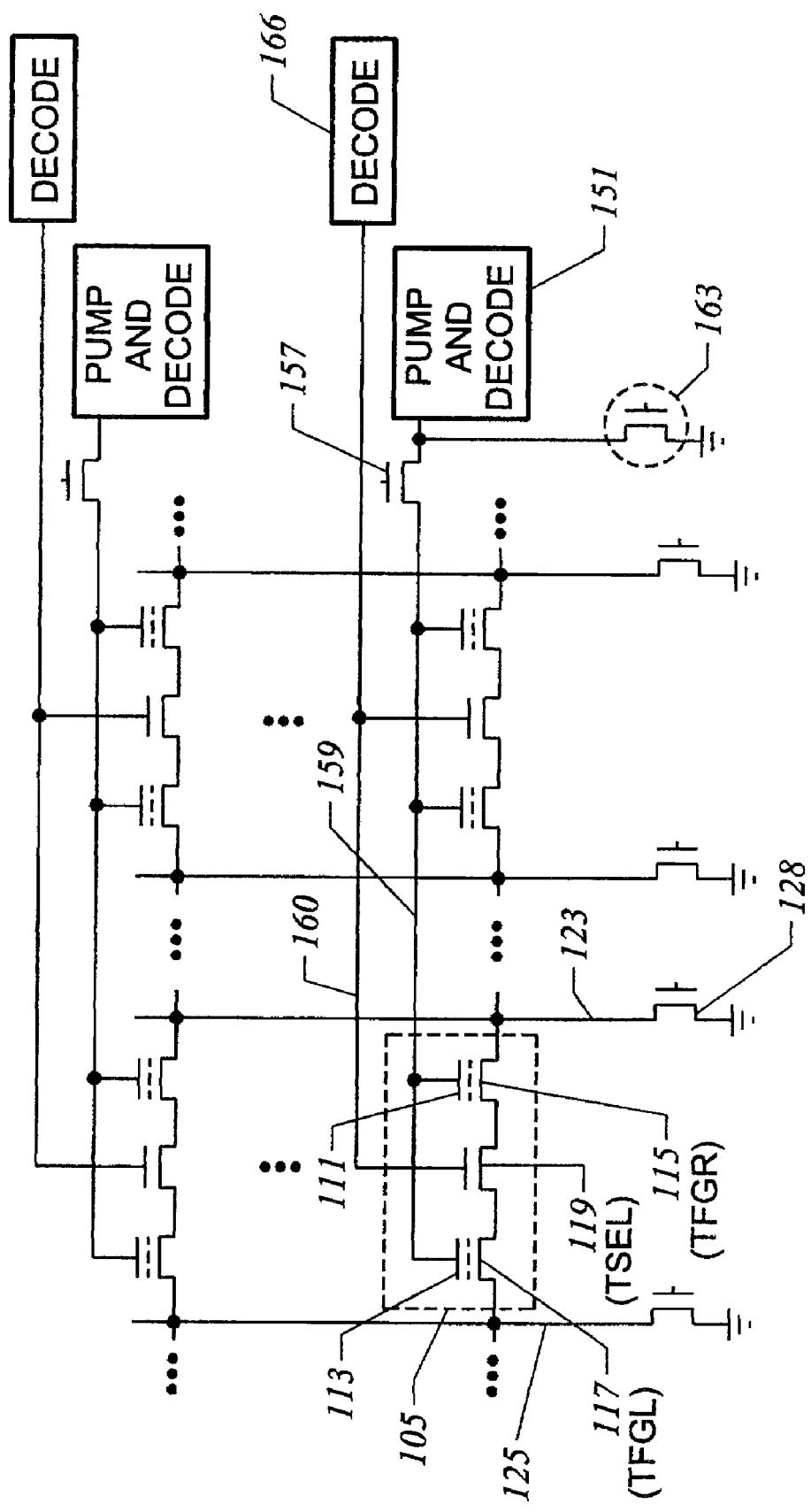
FIG. 1 shows an array of memory cells and circuitry for operating the memory cells.

Some types of nonvolatile storage or memory cell are Flash, EEPROM, and EPROM. The invention also applied to other types of memories such as phase-change memories, NRAM, FRAM, magnetic ferroelectric, and many others. The memory cells are generally arranged within the integrated circuit in an array of rows and columns. FIG. 1 shows an array of Flash memory cells 105. Details of the interconnections of the memory cells are not shown in the figure in order to simplify the diagram. There are many different types and configurations of memory cells. Memory cell 105 is a multibit cell that is described in more detail in U.S. Pat. No. 5,712,180, which is incorporated by reference. This memory cell has a select or select gate line 160, a right control gate or erase gate 111, and a left control gate or erase gate 113. The right control gate is a control electrode of a right floating gate transistor (TFGR) 115, and the left control gate line is a control electrode of a left floating gate transistor (TFGL) 117. The right and left control gates are connected to an erase gate line 159. The select gate line is connected to a gate of a select transistor (TSEL) 119. A decoder 166 is connected to the select gate lines. the select gate lines and corresponding select gates for a row may be enabled or disabled by row using the decoder.

For each memory cell 105, there are two floating gate transistors or cells 115 and 117 to store binary data. Each of these floating gate transistors may store a single bit or multiple bits of data. When storing multiple bits of data, each floating gate cell may also be referred to as a multilevel or multibit cell, because the cell may be programmed to have more than two VT (threshold voltage) levels. For example, each floating gate transistor may store two bits per cell, four bits per cell, or an even greater number of bits per cell.

Floating gate transistors are selectively configured by placing appropriate voltages on drain or source lines 123 and 125, control gate lines 113 and 111, and select lines 160. For example, drain or source line 123 may be selectively grounded by using a transistor 128.

Figures 4, 5:
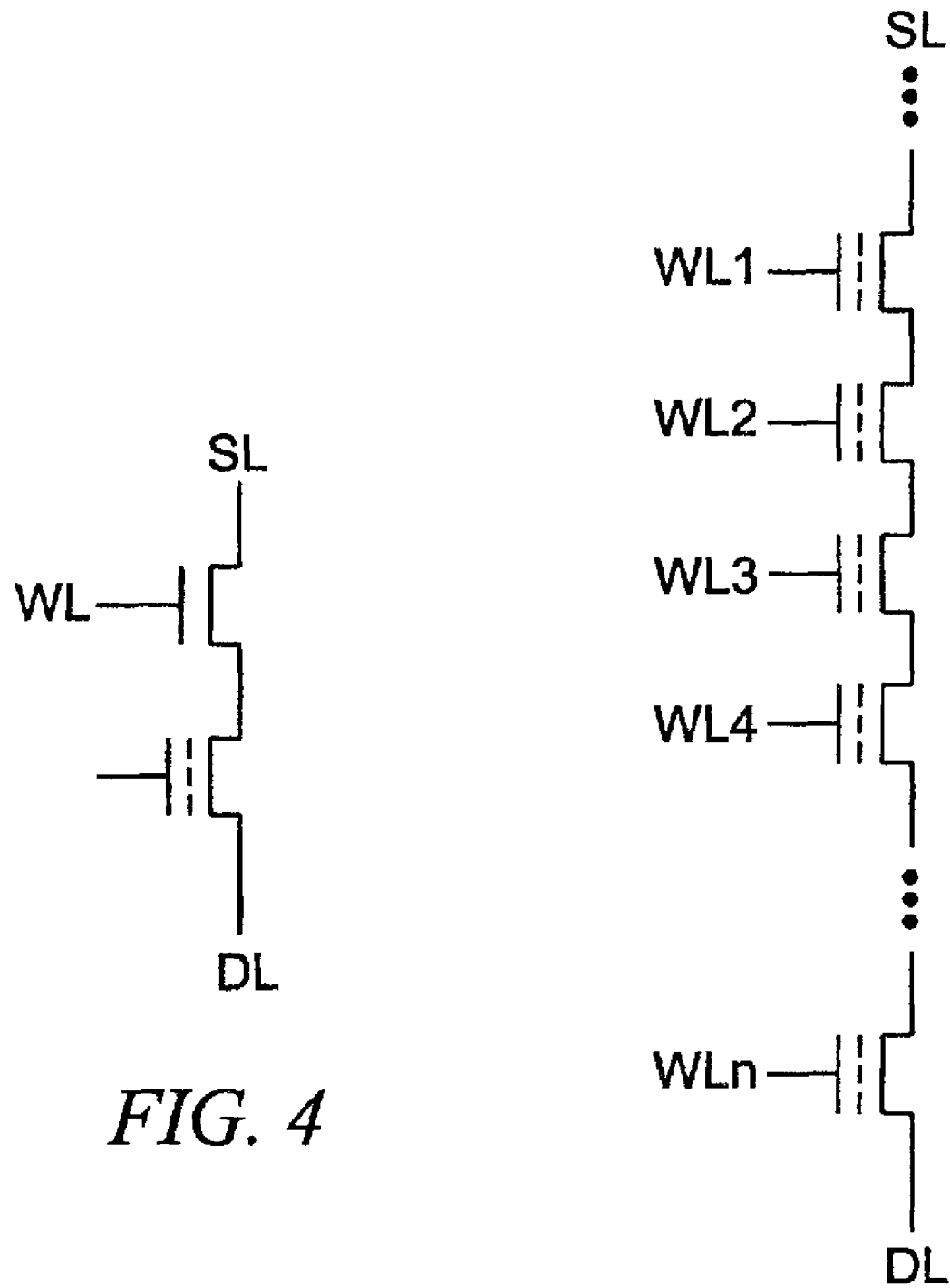
FIG. 4 shows a diagram of a NOR Flash cell.
FIG. 5 shows a diagram of some NAND Flash cells.

The invention will be described with respect to the specific memory cell structure shown in FIG. 1, where there are two floating gate transistors per cell. However, the invention is also applicable to other memory cell structures. For example, the invention may be used for memory cells where there is a single floating gate transistor per cell. In another embodiment, there may be a single floating gate transistor and a single select transistor in each cell. The invention is applicable to memory cells organized in NOR or NAND arrangements. FIG. 4 shows an example of a NOR cell while FIG. 5 shows an example of a NAND cell.

In an embodiment, the invention provides a technique of dynamically applying a voltage to a portion of the memory cells and allowing another operation on other memory cells. By applying a dynamic voltage to some memory cells, this allows a dynamic operation to occur on the selected memory cells. This dynamic operation may be, for example, a dynamic erase, dynamic program, or dynamic read.

In particular, one operation on the memory cells is to place selected floating gate transistors into an erased state. This discussion focuses on dynamic erase, but it is understood that the invention applies analogously to any other dynamic operations including dynamic program and dynamic read. Erase refers to configuring each of the selected floating gate devices to have a VT (threshold voltage) of, for example, below 0 volts. When erased, the floating gate transistor does conduct current even when 1 volt is placed on its gate.

One technique of erasing the selected memory cells involves connecting the erase gate line 159, which is connected to the erase gate of the memory cells, to an erase voltage. The erase voltage is typically a high voltage, which may be above 15 volts. The erase voltage may be from about 15 volts to about 22 volts. The erase voltage may be generated using an on-chip high voltage pump, also known as a charge pump. In other embodiments, the erase voltage may be supplied from an off-chip source to a pin of the integrated circuit.

The erase gates of the memory cells to be erased are continuously driven with the erase voltage until the memory cells are erased. The memory cells are erased when the VTs of the floating gate devices are set to about 0 volts or less. Typically, a relatively large number of memory cells are erased at one time. For example, in a solid state disk, such a Flash card, erase may be performed on a group of cells referred to as a sector. Memory arrays or cells may be erased one row or one column at a time. Or, all the memory cells of the integrated circuit may be bulk erased at the same time.

In one embodiment, the memory cells are initialized to an erased state before they can be placed into a programmed state. The technique of erasing memory cells by continuously driving the select gate has drawbacks. The erase operation typically occurs in 100s of microseconds or even milliseconds. Reading (or sensing) the state of the memory cells typically takes microseconds. Programming the memory cells typically takes in the 10s of microseconds. And, turning the erase pump or charge pump on takes some time in the 1 microsecond to 5 microseconds range.

When erasing by continuously driving the erase gates, the erase pump is turned on and generally consumes power: capacitors of the erase pump are driven using a high-voltage clock oscillator which consumes power. Power consumption of an integrated circuit during an erase mode is typically in the 10s of milliamps. The erase cycle is the entire time period (e.g., 100s of microseconds) from the start of applying the erase voltage to the erase gates until the floating gate devices are erased. During the erase operation, there are no other operations that occur during the entire erase cycle. One of the reasons other operations are not performed during the erase mode is that it is not desirable to further increase the power consumption during the erase mode. Another reason is that certain circuits such as the programming circuitry cannot perform or accomplish dual tasks.

Furthermore, there may be reliability issues when erasing by continuous erase voltage drive. When in a multiple-sector erase mode, all sectors are erased at the same (i.e., highest) voltage that might be required by the hardest to erase sector, thus unnecessarily stressing the faster ones. This may lead to a situation where some memory cells are overerased (i.e., erased to a VT lower than necessary), which puts extra stress on these floating gates. This may lead to a decreased longevity of the overstressed floating gate devices. Therefore, in order to prevent overerase, only certain patterns of multiple sector erase may be available. During the whole erase operation the erase clock and the erase pump are on, burning current. In case of power failure, the sector status (e.g., whether a sector is completely erased) remains uncertain, depending on the time the crash occurred. When the memory chip is in the erase mode, generally other types of operation are not possible.

Figure 2:
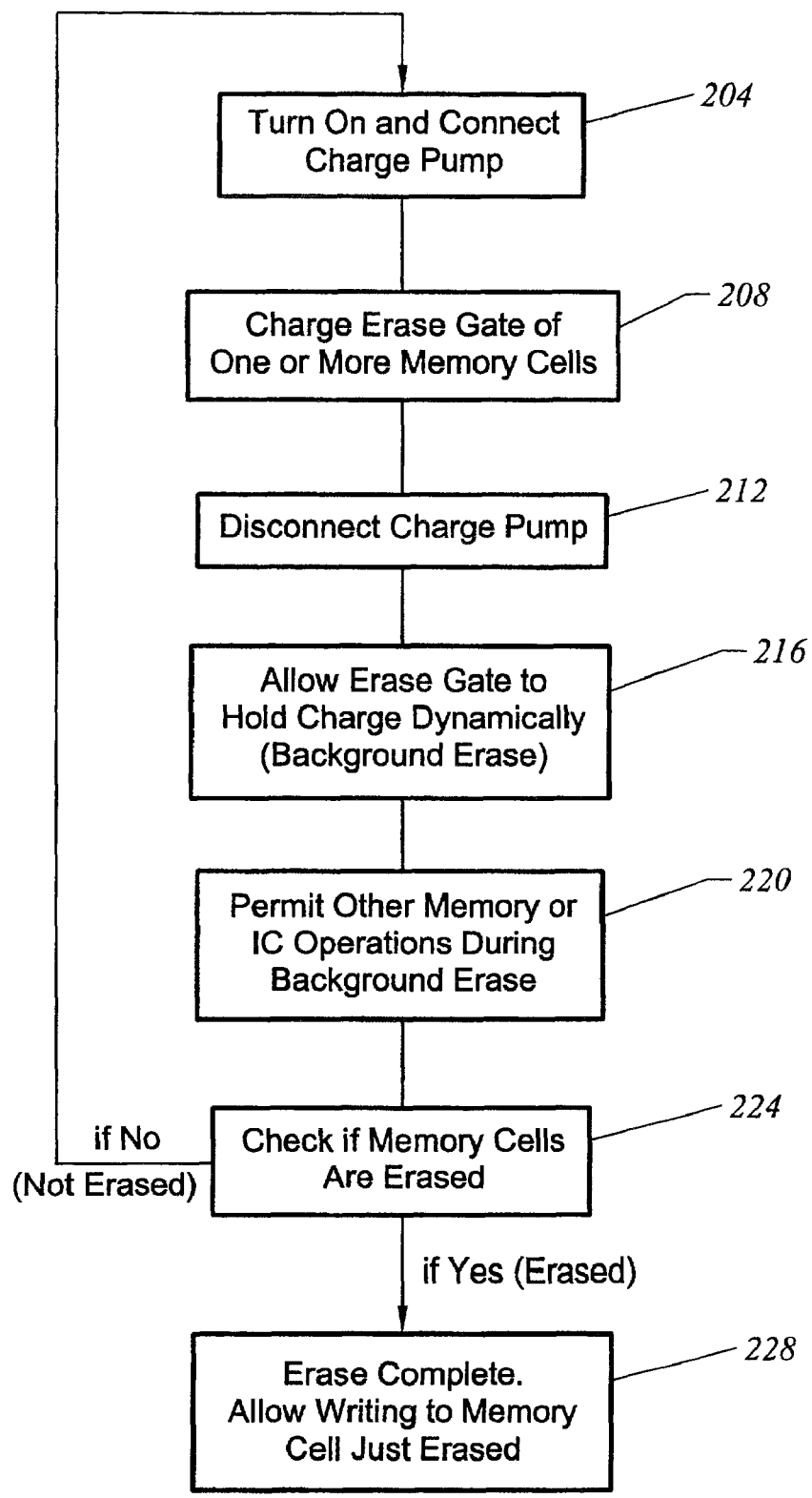
FIG. 2 shows a flow diagram for dynamically erasing memory cells.

A proposed technique of erasing memory cells is to apply the erase voltage dynamically to the control gate (also may be referenced to as erase gate) of the selected memory cells. The technique may be referred to as dynamic erase, latched erase, or background erase. FIG. 2 shows a flow diagram of the dynamic erase technique. Flow diagrams for other dynamic operations (e.g., dynamic program, dynamic read) would be similar. In particular, dynamic erase involves erasing memory cells by turning on the charge pump (box 204). For example, in FIG. 1, a selected erase pump 151 (may also be referred to as erase and decode circuitry) may be turned on or connecting and applied to the selected memory cells. The erase voltage may be selectively applied to the selected erase line using decoding circuitry. The details of the decoder circuitry are not shown, but any typical decoder circuitry may be utilized. Decoder circuitry may include pass transistors and logic gates.

A transfer transistor 157 between the erase pump and the memory cells may be part of the decode or predecode circuitry, and it may be itself connected to an erase pump. Transistor 157 is turned on in order to connect the erase voltage of the erase pump to the erase gates. In order to pass a high voltage from the erase pump through the transfer transistor to the erase line with erase gates, the gate of the transistor need to be at the high voltage level (i.e., erase voltage) plus a VT of the transfer transistor.

The erase gates are charged to the erase voltage (box 208). The erase pump is turned off after gates are charged (box 212) and transistor 157 is turned off. Since there is parasitic capacitance on the erase line 159 (may also be called the word line) connecting the erase (select) transistors, the erase voltage will be held at the erase gates (box 216). Depending on the amount of capacitance, which is generally fairly large (in the picofarad range), the charge on line 159 will decay very gradually, mainly due to charge transfer to the floating gate. During the period when line 159 is charged, the memory cells will be dynamically erased by the dynamic erase voltage. While the erase pump is disconnected or off, other operations may be performed (box 220). For example, other memory cells may be programmed or sensed and read.

The dynamic operation of the memory cells may have a duration depending on on-chip logic, off-chip logic, on-chip timer, off-chip timer, or other circuitry. For example, after some time, the memory cells will be checked if they have been erased or not (box 224). This check may be performed using the sense amplifier circuitry or other on-chip intelligence. Alternatively, the memory cells may be checked by an external circuit, such as a controller integrated circuit. If not erased, the dynamic erase operation occurs again (boxes 204, 208, 212, 216, 220, and 224). The erase voltage may be refreshed to the full erase voltage level (box 216). The erase voltage will be gradually discharged by the equivalent of small currents per erase gate, consumed by the erase operation of removing of electrons from the floating gates. The dynamic erase operation continues until the selected memory cells erased (box 228). The erased memory cells may now be written (or programmed).

By using a dynamic mode of operation, the above problems described with continuous erase voltage drive are solved. Because inherently, the erase line has a capacitance (which at least in part is parasitic capacitance), the erase gate can be first, actively, brought to the desired voltage, which may be digital-to-analog-converter (DAC) controlled. Then, the transfer gate (transistor 157) that was driving it is turned off. Charge remains trapped on the erase line until later when the transfer gate is turned on again, at which point the erase gate is either refreshed or actively discharged to ground.

There are many ways the erase line may be actively discharged to ground. The circuitry may be part of pump and decode circuitry 151. FIG. 1 shows an example of one embodiment. A discharge transistor 163 is connected between the erase line and ground. The discharge transistor may be connected on either side of transistor 157, either on the side of the pump or on the side of the erase gates. In FIG. 1, transistor 163 is connected to the pump side of the transistor 157. This discharge transistor is turned on to discharge the erase line after the memory cells are erased.

By using dynamic erase, any combination or pattern of erase gates can be latched into virtually simultaneous erase. Erase gates may be charged to different erase voltage levels, depending upon their particular needs, which helps prevent overstress. After latching one or more of the erase gates into erase operation, the chip itself can perform any other operation (e.g., read, write, or erase). For example, dynamic erase may be occurring from two or more erase lines at the same time. However, the particular segment where erase is dynamically occurring should be left isolated. Furthermore, dynamic erase may be performed on the erase lines in any desired pattern. For example, alternating rows of memory cells may be erased. The erase clock and the erase pump can be nonactive during most of the erase operation period, saving current. If power failure happens, it does not affect the trapped charge, so only a relatively longer erase will take place.

Furthermore, as discussed above, the erase operation takes a relatively long time compared to other operations such as read or write operation. An integrated circuit using the background feature will operate faster. In other words, many more operations may be done on the integrated circuit with background erase in the same amount of time than compared to an integrated circuit with continuous erase. As an example, a read operation may take about 2 microseconds, an erase operation may take more than about 100 microseconds, and a program operation may take about 10 microseconds. The read operation is about fifty or more times faster than the erase operation. Therefore, fifty or more read operations may occur at the same time as the dynamic erase operation. The program operation is about ten or more times faster than the erase operation. Therefore, ten or more program operations may occur at the same time as the dynamic erase operation.

Because the actual voltage on the erase gate decays over time due to Fowler-Nordheim tunneling to the floating gates or junction leakage, refreshing operations can bring it back to the desired level or an overdrive value can be used instead. An overdrive value may be about 0.5 volts higher than the regular value.

The circuitry to implement dynamic erase operation is much the same as the circuitry used for continuous or static erase operation. Therefore, there is no die size penalty. Furthermore, if for some reason, possibly due to process variations, this mode of operation turns out to be unsatisfactory, normal erase using a continuous or static erase voltage may still be used for those integrated circuits. The integrated circuits where dynamic operation is not functionally because of process or other variations can still be packaged and sold.

Figure 3:
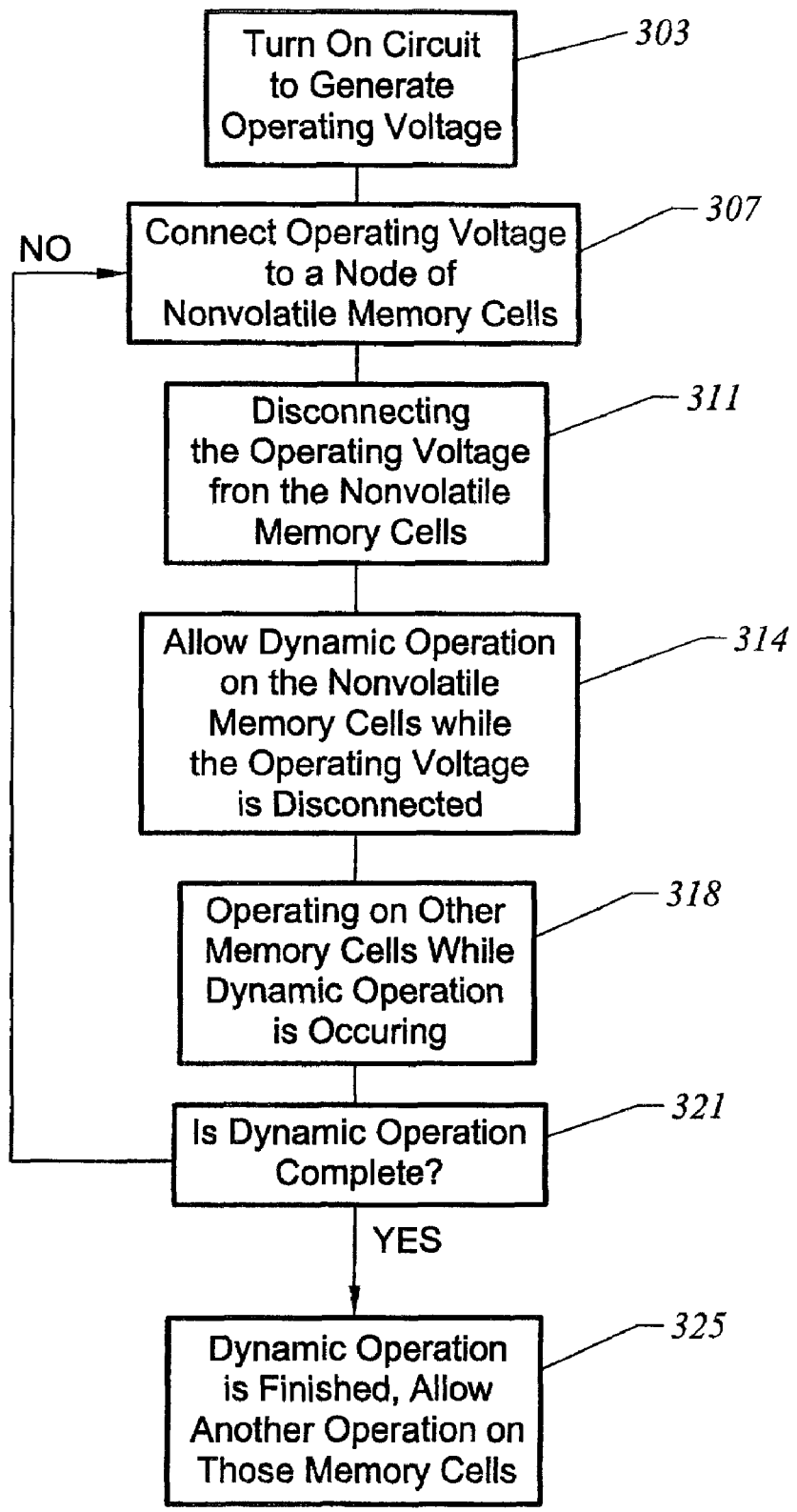
FIG. 3 shows a flow diagram for dynamically operating on memory cells.

FIG. 3 shows an alternative embodiment of the invention, where the dynamic or background operation is not specifically the erase operation. First, the circuitry to generate a required operating voltage is turned on (box 303). The circuitry may be on-chip or off-chip. This circuitry may be, for example, a charge pump, high-voltage switch, or a basic logic gate to output a logic high or logic low.

Next, the operating voltage is connected to one or more nodes of one or more nonvolatile memory cells (box 307). The connection may be, for example, by way of a transfer or pass transistor or logic gate. The node of the memory cell may be the drain, source, gate, erase gate, tunnel node, or any other node or nodes. The node is charged to the operating voltage and this voltage is held there dynamically by capacitance including parasitic capacitance. The operating voltage is disconnected from the memory cells (box 311).

The dynamic operation occurs to the memory cells (box 314). The dynamic operation may be erase, program, or read. While the dynamic operation occurs, other memory cells (not operated on dynamically) may be operated on (box 318). For example, while some memory cells are being dynamically programmed, other memory cells may be read. Or, interleaved program, erase, or read may occur where dynamic operation is occurring on two portions of memory cells, at slightly different starting times. Any combination of different operations may occur as long as that combination does not disturb or interfere with the dynamic operations.

The dynamic operation is checked whether it is complete (box 321). If yes, the operation is finished (box 325) and other operations may occur on the memory cells just dynamically operated on. Otherwise the dynamic operation occurs again (boxes 307, 311, 314, 318, and 321) until complete. The circuitry used to detect completion of the dynamic operation may be on-chip, off-chip, and use sense amplifier or timer circuit.

FIG. 4 shows a nonvolatile memory cell for a NOR configuration.

FIG. 5 shows nonvolatile memory cells in a NAND configuration.

In FIGS. 4 and 5, the nonvolatile memory cells are floating gate devices such as Flash, EEPROM, or EPROM.

Latched Programming for Nonvolatile Memory with NAND Structure

The background memory operation by latching an operating voltage onto a node of the memory cells is particularly suited for those memory operations that involve transfer of charge by tunneling to or from a charge storage element.

Examples of background erase operation using the Fowler-Nordheim tunneling mechanism has been described earlier. Typically, a nonvolatile memory cell has a charge storage element (e.g., a floating gate) sandwiched between a channel region and a control gate. The Fowler-Nordheim tunneling takes place when a high voltage, and therefore electric field, exists between the substrate and the charge storage element so as to induce electrons in the charge storage element to tunnel through a thin oxide to the substrate channel region. This is accomplished by applying a high voltage to the substrate relative to the control gate. In this way, the charge storage element also acquires a high potential difference relative to the substrate by virtue of capacitive coupling.

In memory with NAND structure, the preferred programming mechanism is by "tunneling injection," which may be regarded as a reverse Fowler-Nordheim tunneling. A high voltage is applied to the control gate relative to the substrate. In this way, electrons are pulled from the substrate to the intervening charge storage element.

Figure 6:
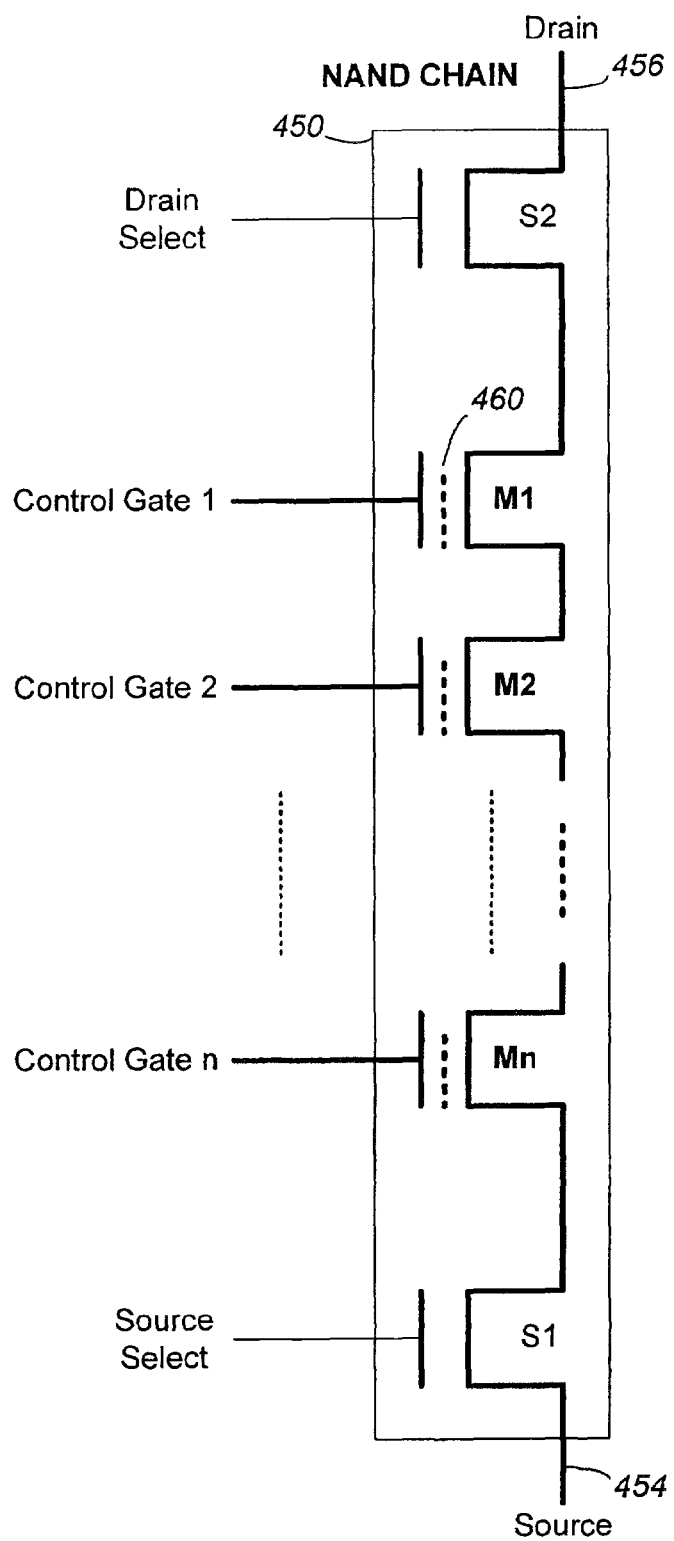
FIG. 6 illustrates schematically a string of memory cells organized into a NAND chain.

FIG. 6 illustrates schematically a string of memory cells organized into a NAND chain. An NAND chain 450 consists of a series of memory transistors M1, M2, ... Mn (e.g., n=4, 8, 16 or higher) daisy-chained by their sources and drains. A pair of select transistors S1, S2 controls the NAND chain's connection to the external via the NAND chain's source terminal 454 and drain terminal 456. A control gate of each of the select transistors S1, S2 provides controlled access to the NAND chain. When the source select transistor S1 is turned on, the source terminal is coupled to a source line. Similarly, when the drain select transistor S2 is turned on, the drain terminal of the NAND chain is coupled to a bit line of the memory array.

Each memory transistor in the chain has a charge storage element 460 to store a given amount of charge so as to represent an intended memory state. A control gate of each memory transistor provides control over the current flow in a channel defined by its source and drain. In fact, the current flow in the channel is a function of the effective field on the channel, which is the combined effect of the field exerted at the control gate and the charge storage element. The entire NAND chain can be regarded as having combined channel between the source and drain terminal. The combined channel is constituted from the channels of the individual memory cells in the chain. When an addressed memory transistor within a NAND chain is read and verified during programming, its control gate is supplied with an appropriate voltage. At the same time, the rest of the non-addressed memory transistors in the NAND chain 450 are fully turned on by application of sufficient voltage on their control gates. In this way, a conductive channel is effective created from the source of the individual memory transistor to the source terminal 454 of the NAND chain and likewise for the drain of the individual memory transistor to the drain terminal 456 of the chain.

Figure 7:
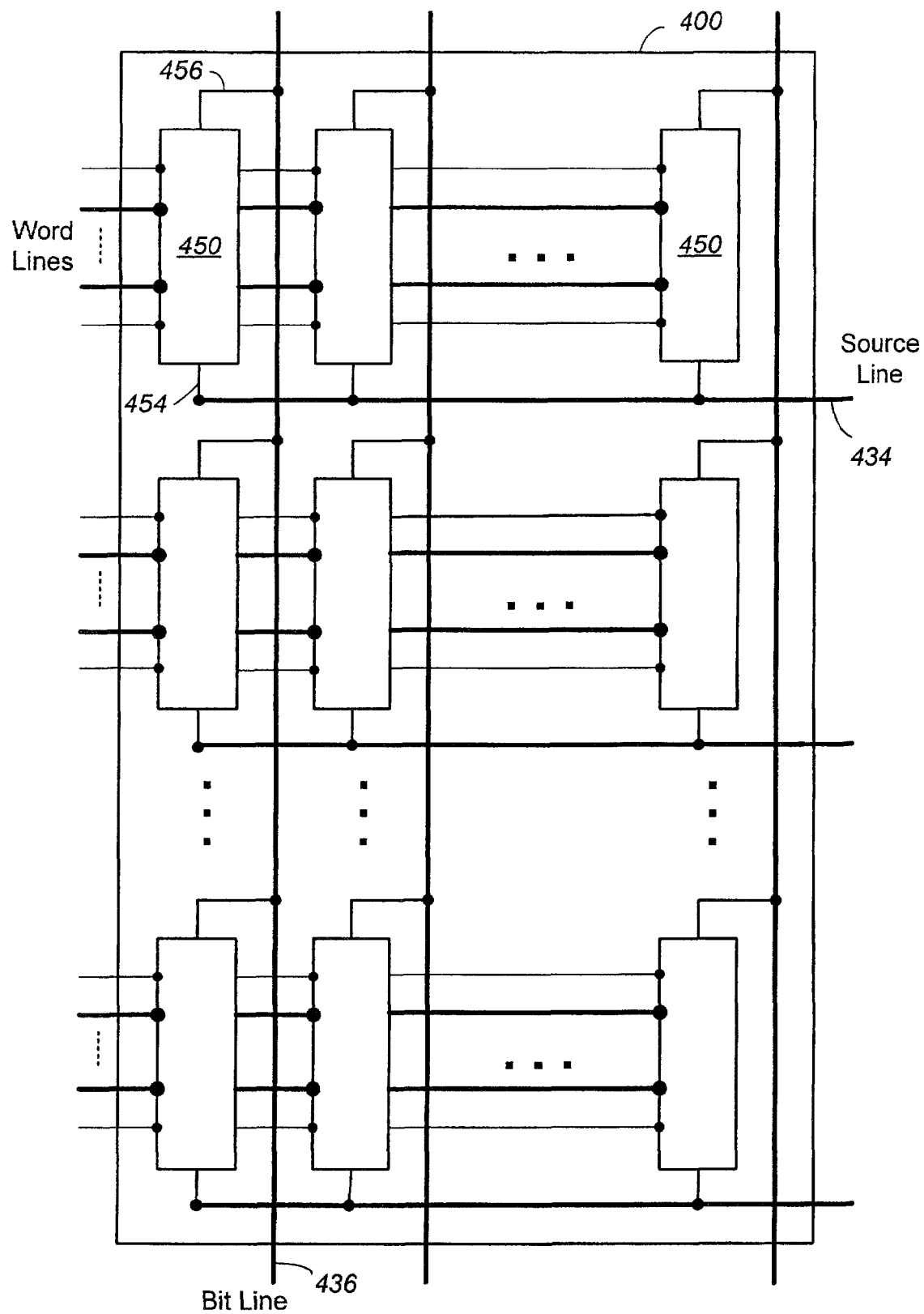
FIG. 7 illustrates an example of a memory array organized as an array of NAND chains.

FIG. 7 illustrates an example of a memory array organized as an array of NAND chains. Along each column of NAND chains, a bit line 436 is coupled to the drain terminal 456 of each NAND chain 450. Along each row of NAND chains, a source line 434 may connect all their source terminals 454. Also the control gates of the NAND chains along a row are connected to a series of corresponding word lines. An entire row of NAND chains can be addressed by turning on the pair of select transistors S1 and S2 (see FIG. 6) with appropriate voltages on their control gates via the connected word lines. When a memory transistor within a NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774, 397 and 6,046,935.

Figure 8:
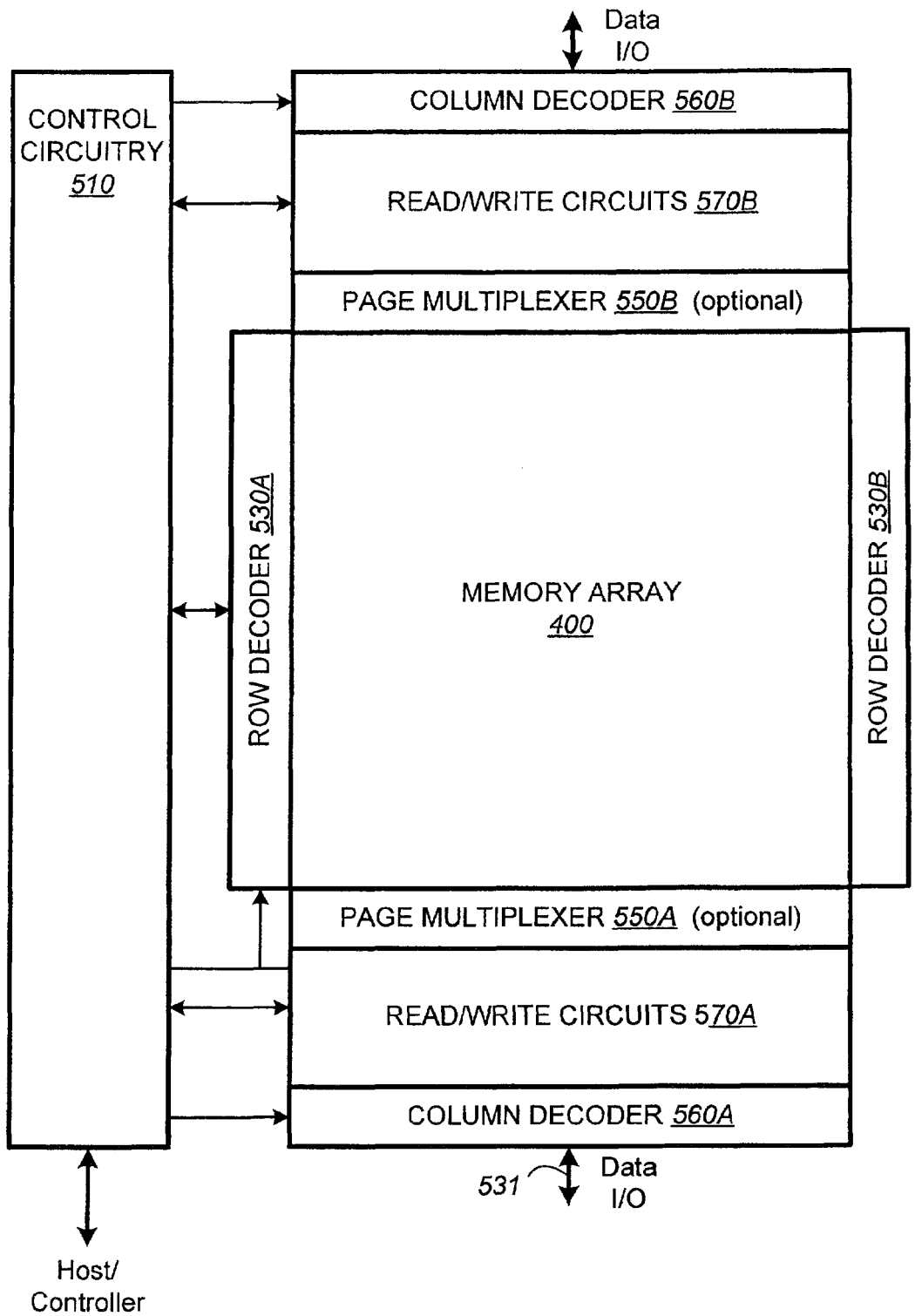
FIG. 8 illustrates a preferred arrangement of a memory device suitable for practicing the present invention.

FIG. 8 illustrates a preferred arrangement of a memory device suitable for practicing the present invention. The memory device includes a two-dimensional array of memory cells 400, control circuitry 510, and read/write circuits 570A and 570B. The memory array 400 is addressable by word lines via row decoders 530A and 530B and by bit lines via column decoders 560A and 560B. The read/write circuits 570A and 570B include multiple sense amplifiers and allow a page of memory cells to be read or programmed in parallel. In one embodiment, where a row of memory cells are partitioned into multiple pages, page multiplexers 550A and 550B are provided to multiplex the read/write circuits 570A and 570B to the individual pages.

The control circuitry 510 cooperates with the read/write circuits to perform memory operations on the memory array 400. The control circuitry 510 includes a state machine 512, an on-chip address decoder 514 and a power control module 516. The state machine 512 provides chip level control of memory operations. The on-chip address decoder 514 provides an address interface between that used by the host or a memory controller to the hardware address used by the decoders 530A and 530B and 570A and 570B. The power control module 516 controls the power and voltages supplied to the word lines and bit lines during memory operations.

Access to the memory array 400 by the various peripheral circuits is implemented in a symmetric fashion, on opposite sides of the array so that the densities of access lines and circuitry on each side are reduced in half. Thus, the row decoder is split into row decoders 530A and 530B and the column decoder into column decoders 560A and 560B. In the embodiment where a row of memory cells are partitioned into multiple pages, the page multiplexer 550 is split into page multiplexers 550A and 550B. Similarly, the read/write circuits are split into read/write circuits 570A connecting to bit lines from the bottom and read/write circuits 570B connecting to bit lines from the top of the array 400. In this way, the density of the read/write modules, and therefore that of the sense modules 580, is essentially reduced by one half.

FIG. 9 illustrates a table of example operation voltages for programming operation of a memory cell. In the preferred embodiment, a program operation includes a series of interleaving programming and verifying steps. A page of memory cells is operated on in parallel.

Figure 10:
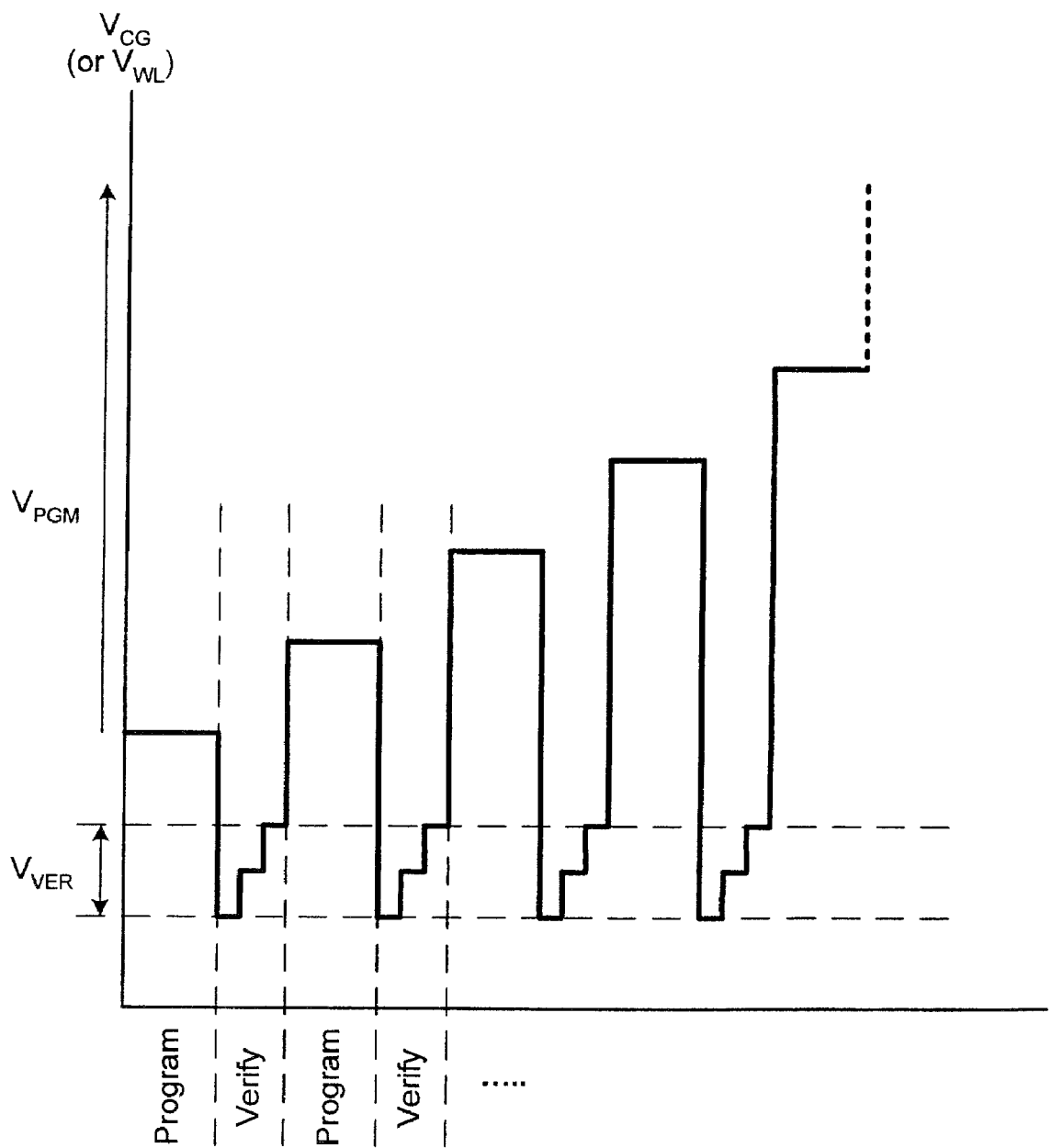
FIG. 10 illustrates a timing diagram of typical voltage applied to the control gates of the page of memory cells via the selected word line during a conventional program operation.

FIG. 10 illustrates a timing diagram of typical voltage applied to the control gates of the page of memory cells via the selected word line during a conventional program operation. The programming voltage $V_{PGM}$ is applied during each programming step while the verifying voltage $V_{VER}$ is applied during each verifying step.

During a programming step, all cells of the page are exposed to the programming pulses $V_{PGM}$ through the selected word line connecting their control gates. The individual cells among the page are selectively enabled for or inhibited from programming by the voltage condition at their respective bit lines. Those memory cells having 0V on their drain lines (i.e., bit lines) will be programmed, while those having Vdd on their drain lines will be inhibited.

A verifying step follows each programming step. After each programming step with the application of a dose of programming voltage on the selected word line, the memory cells are checked to determine if they have been programmed to their target state. FIG. 10 illustrates verifying steps for a 4-state memory cell. The four states are demarcated by three breakpoints, hence three different sensing with different $V_{VER}$ values. As shown in FIG. 9, during verifying, the bit line voltage is reset to $V_{BLSEN}$, typically between 0.5-0.7V. After each verifying step, those memory cells that have been programmed to their targeted state will be program-inhibited or locked out from further programming. For those memory cells to be inhibited, the associated bit line will be set to Vdd before the next programming step.

The cycle then proceeds with another programming step and so forth until all memory cells of the page have been programmed properly.

In NAND type of memory, the memory storage units are locked out by floating their channels and boosting the voltage there to inhibit programming. This is accomplished by setting the drain line voltage to Vdd, which is a predetermined system voltage, e.g., ~2.5V. This effectively turns off disconnects the NAND chain 450 from its bit line 436, and floats the channel of the NAND chain so that it can be capacitively boosted up to a high voltage when a high voltage (e.g., 10V and $V_{PGM}$) appears on the word lines. For example, in this way, the channel can be boosted to 10V. Boosting up the channel voltage will effectively reduce the potential difference between the channel and the charge storage unit of the memory cell in question, thereby discouraging pulling electrons from the channel to tunnel to the charge storage unit to effect programming even when a high voltage is applied to its control gate.

Figure 11:
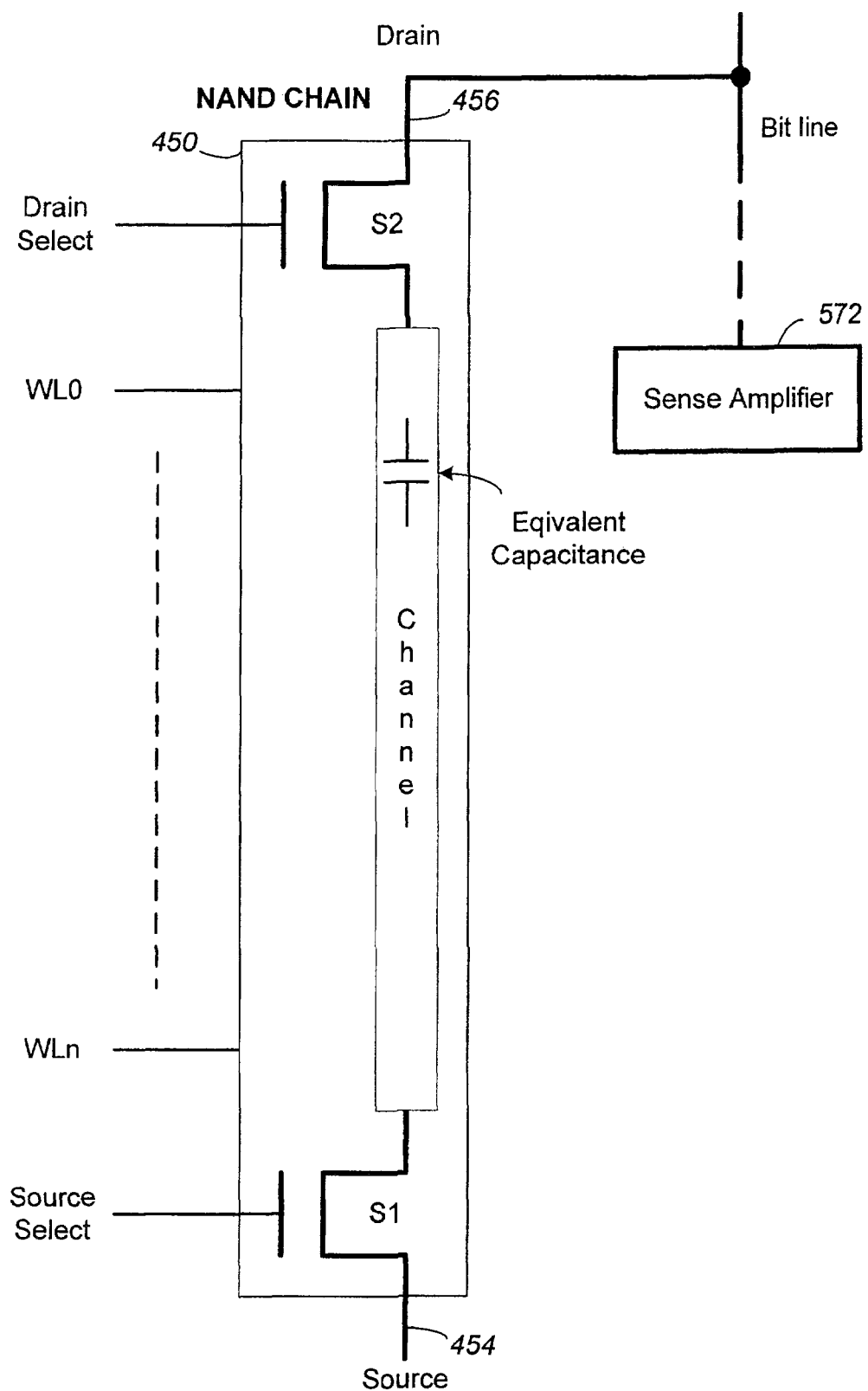
FIG. 11 is another schematic of the NAND chain shown in FIG. 6, showing in particular the drain select transistor and the channel capacitance used to latch a program-enabling or program-inhibiting voltage, according to a preferred embodiment of the invention.

FIG. 11 is another schematic of the NAND chain shown in FIG. 6, showing in particular the drain select transistor and the channel capacitance used to latch a program-enabling or program-inhibiting voltage, according to a preferred embodiment of the invention. Since the NAND chain 450 is constituted from a daisy chain of multiple memory cells, the channel of the chain will therefore have a capacitance a multiple of that of the channel of an individual memory cell. The capacitance of the channel of the NAND chain is employed to latch the bit line voltage to either enable or inhibit programming of the associated memory cell during the programming step.

Figure 12:
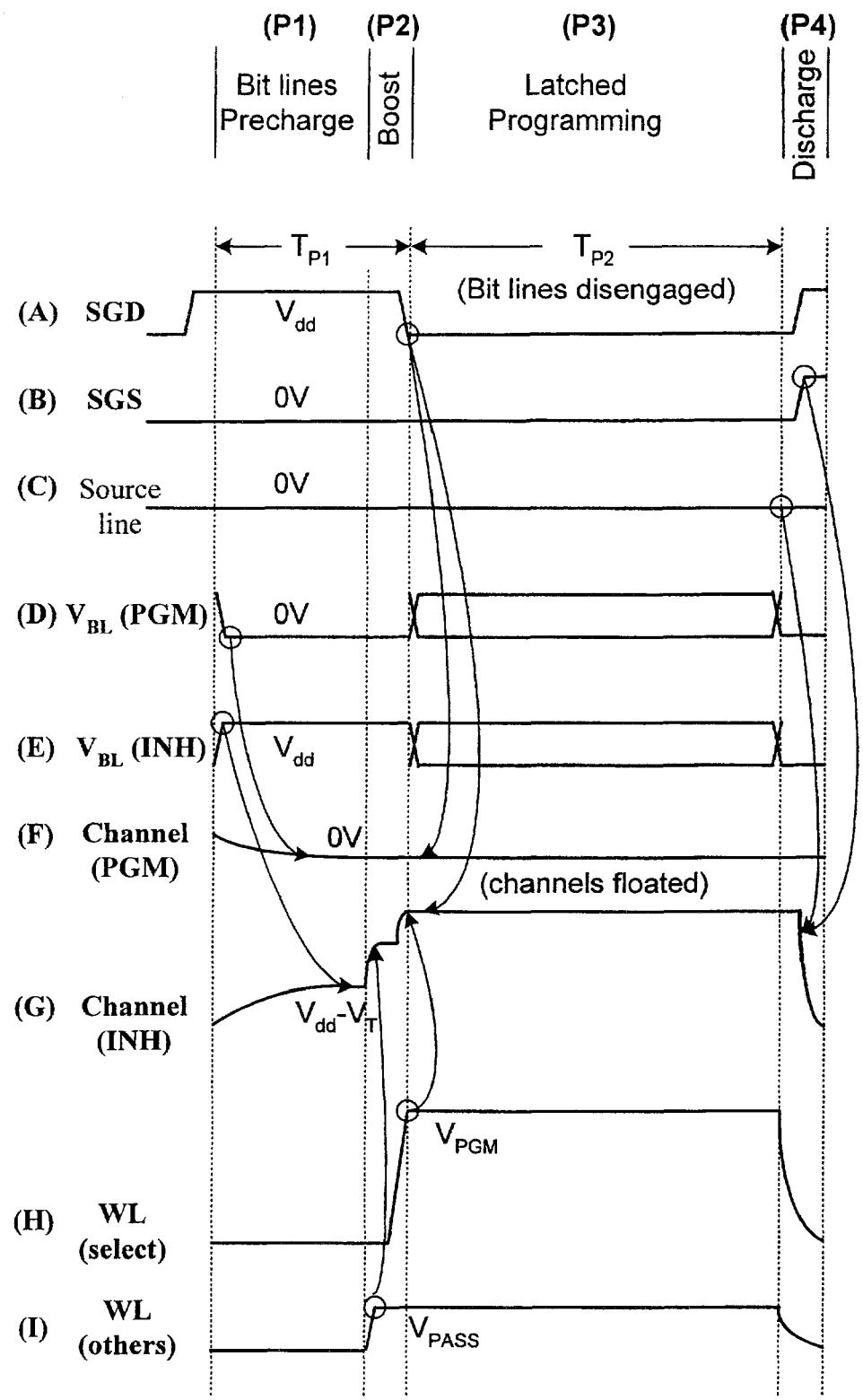
FIG. 12 is a timing diagram of the programming step with channel voltage latching.

FIG. 12 is a timing diagram of the programming step with channel voltage latching. Generally, the programming step comprises of four phases. Period (P1) is the bit line precharge phase. The bit lines are precharged to either Vdd (FIG. 12(E)) for putting the coupled memory cell in a condition for program-inhibition or 0V (FIG. 12(D)) for program-enablement. Period (P2) is the boosting phase. Voltages are supplied to the word lines of the unselected memory cells of the NAND chain (FIG. 12(I)). This has the effect of boosting the NAND channel voltage of those cells whose bit lines are set at Vdd (FIG. 12(G)). After the NAND channel of those cells to be program inhibited have been boosted, the drain select transistor is turned off by SGD going LOW. This disengages the bit lines from the NAND chains.

The third period (P3) is the programming phase. Whereas Periods (P1) and (P2) constitute the voltage setup on the channel of the page of memory cells, the period (P3) is where the actual application of the programming pulse to move electrons from the substrate to the charge storage element. A programming voltage is supplied to the word line of the selected memory (FIG. 12(H)). Only those memory cells in NAND chains with non-boosted channels will be programmed. Programming is inhibited in those memory cells with a boosted channel because of reduced electric field between the boosted channel and the charge storage element. Programming is performed with the bit lines disengaged from the NAND cell, but with the voltage condition of the channels held dynamically by its capacitance.

The fourth period (P4) is the discharge phase, which is relative short compared to the period for program setup, $T_{P1}$, and the period for latched programming, $T_{P2}$. The high voltages on the word lines are allowed to discharge. Both the drain terminal and the source terminal of each NAND chain are reconnected to the bit line and the source line respectively. This is accomplished by turning on the drain select transistor and the source select transistor. Thus, SGD and SGS go to Vdd (FIGS. 12(A), 12(B)). The channel is discharged via the source line to ground.

Thus, to inhibit programming of certain cells along a row, Vdd is applied to their associated bit lines in the bit line precharge phase(FIG. 12(E)). In the preferred embodiment, a sense amplifier coupled to each bit line sets the bit line voltage under the control of the controller (see FIG. 11.) For each of the cells, with its drain select transistor S2 turned on with Vdd at its gate (as is for the rest of the row), its NAND channel is connected to its associated bit line and charges up to Vdd-$V_T$ (where $V_T$ is the threshold voltage of the drain select transistor.) (FIG. 12(G), (P1)) Then, in the boosting phase, Vpass is applied to the control gates of the unselected memory cells in the NAND chain via the unselected word lines. The channel voltage rises as a result of coupling and when it rises beyond Vdd, the drain select transistor is effective turned off. This floats the channel and results in even stronger boosting of the channel voltage by the voltages at the word lines. The boosting phase is followed by the programming phase with the application of the programming voltage to the selected word line. As soon as the channel has been boosted substantially after the voltages on the word lines have substantially peaked, the drain select transistor is turned off by a low voltage at its gate. This will latched the boosted voltage at the channel to effect program inhibit until the completion of the programming step. At the same time the NAND cell is detached from its associated bit line, and this allows the same bit line to be used, in the meantime, by another NAND cell in the same column.

Similarly, to allow programming of the other cells along a row, 0V is applied to their associated bit lines in the bit line precharge phase. For each of the cells, with its drain transistor turned on, its NAND channel is connected to its associated bit line and is essentially pinned at ground potential. Then, in the boosting phase, $V_{PASS}$ is applied to the control gates of the unselected memory cells in the NAND chain via the unselected word lines. Unlike the inhibit case, the channel voltage does not get boosted as it is pinned at 0V. The boosting phase is followed by the programming phase with the application of the programming voltage to the selected word line. As soon as the word lines have substantially peaked, the drain select transistor is turned off by a low voltage at its gate. This will latched the 0V voltage at the channel to effect programming until the completion of the programming step. At the same time the NAND cell is detached from its associated bit line, and this allows the same bit line to be used, in the meantime, by another NAND cell in the same column.

Memory sensing and verifying after a programming step have been disclosed in co-pending and published U.S. patent application Ser. No. 10/254,830, filed Sep. 24, 2002. The entire disclosure is hereby being incorporated herein by reference.

FIG. 13 illustrates a conventional programming cycle where in a program operation is a series of interleaving programming and verifying steps. Each programming step has a period given by $T_P$ and each verifying step has a period given by $T_S$. If the program operation requires n programming steps, then the total program operation time will be $n(T_P+T_S)$.

As described earlier, the present invention allows the same set of bit lines to transfer a first set of voltage conditions to a first page of memory cells and be held dynamically by the first page to perform a first memory operation while the set of bit lines is freed up to perform another memory operation. In one embodiment, the other memory operation is the next verifying step on the first page of memory. Unlike the conventional case, the verifying step can commence ahead of the completion of the programming step. The bit lines are precharged for the next verifying step of the same page. In another embodiment, two pages of memory cells are being programmed contemporarily, so that while one page is being programmed, the other page can be verified with the use of the bit lines.

FIG. 14 illustrate the embodiment where the verifying step commences ahead of the completion of the programming step during program operation on a page of memory cells. Each programming step has a period given by $T_P \sim T_{P1}+T_{P2}$, where $T_{P1}$ is the programming setup time and $T_{P2}$ is the program pulsing time. As shown in FIG. 12 (A), the bit lines are free during the latch programming period $T_{P2}$. On the other bit lines are required by the verifying step during its entire duration. Each verifying step has a period given by $T_S \sim T_{S1}+T_{S2}$, where $T_{S1}$ is the sensing setup time and $T_{S2}$ is the actual data sensing time. In the verifying step, the sensing must be performed after the completion of the programming step. However, its setup time $T_{S1}$, which may be significant, can overlap with the latch programming period since it can have exclusive use of the bit lines for precharge operation. Thus, each program-verify cycle is approximately of duration $T_P+T_{S2}$ and the total program operation time will be $n(T_P+T_{S2})$, which may be significantly less than the convention case shown in FIG. 13.

Figure 15A:
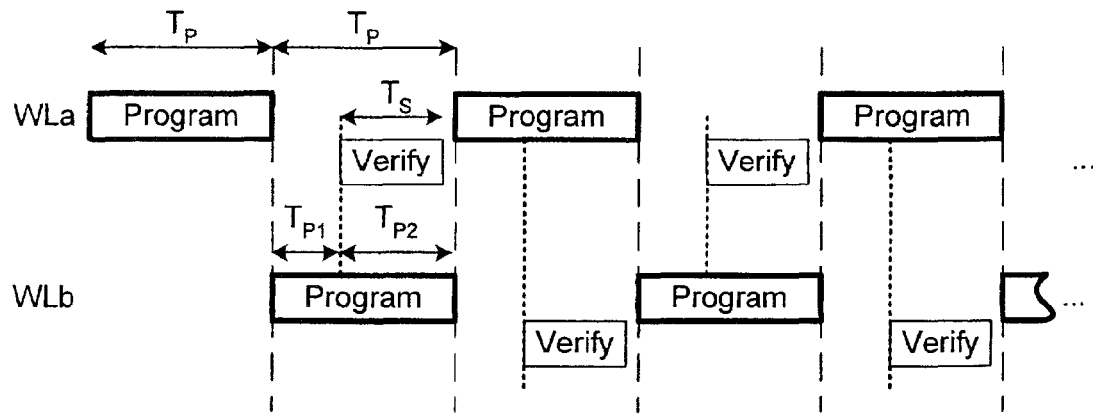
FIG. 15A illustrates another embodiment in which two pages of memory cells shares the same set of bit lines for efficient, parallel operations.

FIG. 15A illustrates another embodiment in which two pages of memory cells shares the same set of bit lines for efficient, parallel operations. As one page is undergoing a programming step, the other page is undergoing a verifying step. In the example given, two different pages of memory cells respectively reside among two different rows of NAND chains in the memory array. After the appropriate program-enabling or program inhibiting voltage condition has been transferred to individual memory NAND chains containing the page, the voltage conditions are boosted and latched by the individual channels. The bit lines are then freed after $T_{P1}$. At this time, the second page can engage the bit lines for a verifying step. If the entire verifying step can be subsumed within the latched programming period of $T_{P2}$, then the average programming operation will be just $nT_{P1}$, with no expense for the verifying steps.

Figure 15B:
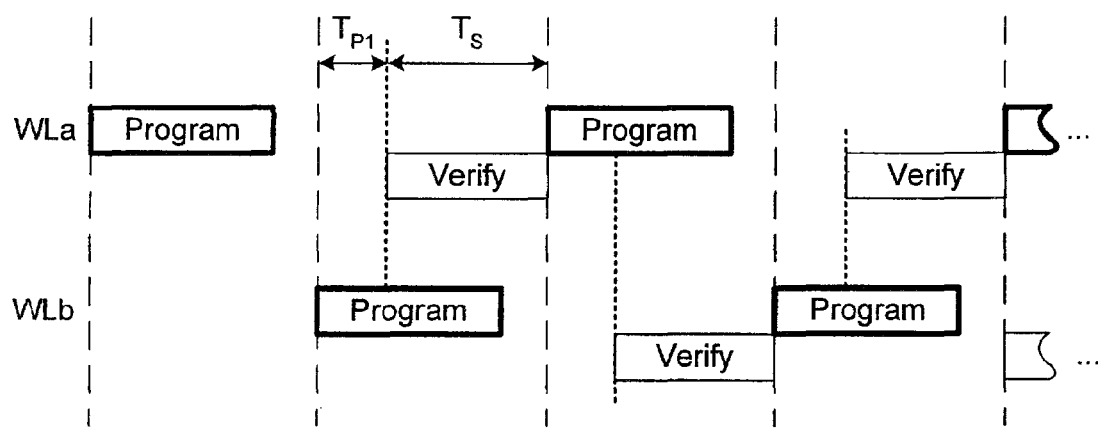
FIG. 15B illustrates another possibility of the two-page programming embodiment shown in FIG. 15A in which the verifying step has a period longer than the latch programming period.

FIG. 15B illustrates another possibility of the two-page programming embodiment shown in FIG. 15A in which the verifying step has a period longer than the latch programming period. In this case, the overall program-verify period is given by $T_{P1}+T_S$ and the average programming operation will be just $n(T_{P1}+T_S)$.

Figure 16:
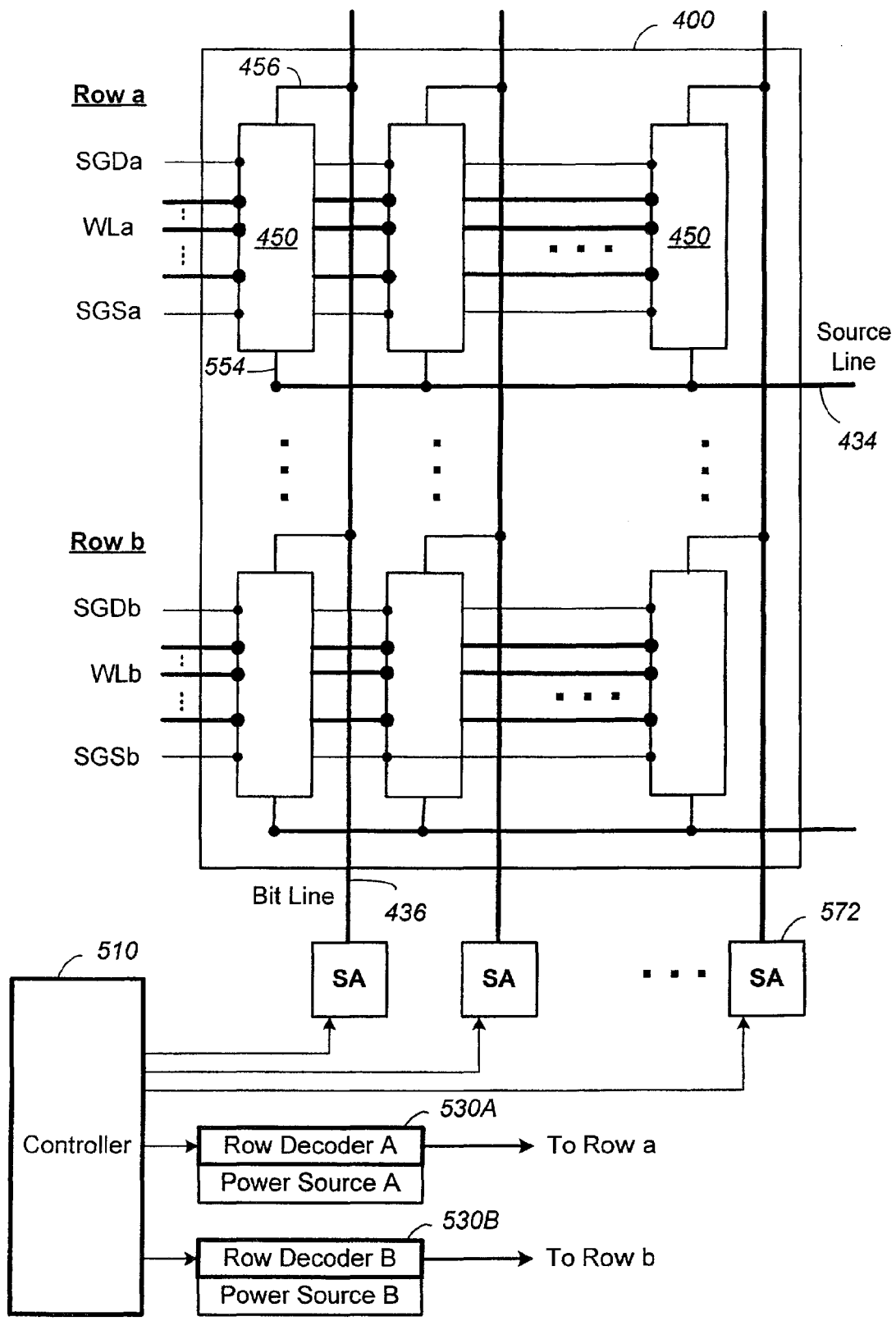
FIG. 16 illustrates a memory device capable of performing pipelined programming and verifying for two pages of memory cells simultaneously, according to a preferred embodiment of the invention.

FIG. 16 illustrates a memory device capable of performing pipelined programming and verifying for two pages of memory cells simultaneously, according to a preferred embodiment of the invention. Each page of memory cells resides within a corresponding page of NAND chains 450 along a row of the memory array 400. The first page of memory cells has its control gates connected by a word line WLa and their drain select transistor S2 and source select transistor S1 (see FIG. 11.) controlled by signals SGDa and SGSa respectively. The sources of the page of memory cells are connected to a source line 434. Similarly, the second page of memory cells has its control gates connected by a word line WLb and their drain select transistor and source select transistor controlled by signals SGDb and SGSb respectively.

The two pages of memory cells share a set of bit lines 436 coupled to a corresponding set of sense amplifiers 572. The controller 510 controls the sense amplifiers which provide the necessary precharge voltage to the bit lines and perform sensing operations such as verifying after a programming step. The controller also controls the voltages supplied to the various source and drain select lines and word lines for the two pages of NAND chains independently.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

It is claimed:

1. A method of operating an integrated circuit with non-volatile memory cells, which method comprises:
    connecting a source of an operating voltage to one or more gates of memory cells selected for operation at the operating voltage;
    disconnecting the source from the gates and allowing the disconnected gates to hold the operating voltage dynamically while they are disconnected; and operating the selected memory cells using the dynamic voltage.

2. A method according to claim 1, wherein the source of operating voltage is periodically reconnected to the gates of selected memory cells.

3. A method according to claim 1 including the step of accessing whether the specified operation has been accomplished and, if the operation has not been accomplished, reconnecting the source to the gates.

4. A method according to claim 2 including the step of accessing whether the specified operation has been accomplished and, if the operation has not been accomplished, reconnecting the source to the gates.

5. A method according to claim 1, which permits programming of nonvolatile memory cells, other than the selected nonvolatile memory cells, while the source is not connected.

6. A method according to claim 1, which permits reading of nonvolatile memory cells, other than the selected nonvolatile memory cells, while the source is not connected.

7. A method according to claim 1 wherein the source is a charge pump for generating an erase voltage, wherein the gates of the selected memory cells are erase gates, and wherein the operation on the selected memory sells is an erase operation.

8. A method according to claim 7 wherein each nonvolatile memory cell comprises two floating gate transistors and one select transistor having an erase gate.

9. A method according to claim 7 wherein the erase voltage is in the range 15 to 22 volts.

10. A method according to claims 7 including the step of discharging the erase voltage from the erase gates after the selected memory cells are erased.

11. An integrated circuit comprising:
an array of memory cells arranged in rows and columns;
a plurality of transfer transistors, each coupled to a row of the array of memory cells; and
an erase pump coupled to one of the transfer transistors, to dynamically charge erase gates of a row of memory cells to an erase voltage through a respective transfer transistor, the erase voltage being dynamically held at the erase gates by turning off the respective transistor.

12. An integrated circuit according to claim 11, further comprising:
a controller for controlling operations of the integrated circuit;
said controlling includes:
connecting a source of an operating voltage to one or more gates of memory cells selected for operation at the operating voltage;
disconnecting the source from the gates and allowing the disconnected gates to hold the operating voltage dynamically while they are disconnected; and
operating the selected memory cells using the dynamic voltage.

13. A method according to claim 12, wherein the source of operating voltage is periodically reconnected to the gates of selected memory cells.

14. A method according to claim 12 including the step of accessing whether the specified operation has been accomplished and, if the operation has not been accomplished, reconnecting the source to the gates.

15. A method according to claim 13 including the step of accessing whether the specified operation has been accomplished and, if the operation has not been accomplished, reconnecting the source to the gates.

16. A method according to claim 12, which permits programming of nonvolatile memory cells, other than the selected nonvolatile memory cells, while the source is not connected.

17. A method according to claim 12, which permits reading of nonvolatile memory cells, other than the selected nonvolatile memory cells, while the source is not connected.

18. A method according to claim 12 wherein the source is a charge pump for generating an erase voltage, wherein the gates of the selected memory cells are erase gates, and wherein the operation on the selected memory sells is an erase operation.

19. A method according to claim 18 wherein each nonvolatile memory cell comprises two floating gate transistors and one select transistor having an erase gate.

20. A method according to claim 18 wherein the erase voltage is in the range 15 to 22 volts.

21. A method according to claims 18 including the step of discharging the erase voltage from the erase gates after the selected memory cells are erased.

* * * * *